United States Patent [19]

Nishimura et al.

[11] 4,414,242

[45] Nov. 8, 1983

[54] PROCESS FOR FABRICATING A SEMICONDUCTOR DEVICE

[75] Inventors: Tadashi Nishimura, Hyogo; Yoji Mashiko, Takarazuka, both of Japan

[73] Assignee: Mitsubishi Denki Kabushiki Kaisha, Tokyo, Japan

[21] Appl. No.: 444,095

[22] Filed: Nov. 24, 1982

[30] Foreign Application Priority Data

Nov. 26, 1981 [JP] Japan .................................. 56-190228

[51] Int. Cl.³ ........................ B05D 3/06; H01L 21/263
[52] U.S. Cl. ............................ 427/43.1; 219/121 LE; 219/121 LF; 427/53.1
[58] Field of Search ....................... 427/35, 53.1, 43.1; 219/121 LE, 121 LF

[56] References Cited

U.S. PATENT DOCUMENTS

| | | | |
|---|---|---|---|
| 4,269,631 | 5/1981 | Anantha et al. | 427/53.1 |
| 4,292,091 | 9/1981 | Togei | 427/53.1 |
| 4,303,455 | 12/1981 | Splinter et al. | 427/53.1 |
| 4,372,990 | 2/1983 | Lam | 427/53.1 |
| 4,381,202 | 4/1983 | Mori et al. | 427/53.1 |

OTHER PUBLICATIONS

Lam, H. W., et al, "Characteristics of MOSFETS Fabricated in Laser-Recrystallized Polysilicon Islands with a Retaining Wall Structure . . . Substrate," *IEEE Electron Device Letters,* vol. EDL-1, No. 10, Oct. 1980.

*Primary Examiner*—John H. Newsome
*Attorney, Agent, or Firm*—Sughrue, Mion, Zinn, Macpeak, and Seas

[57] ABSTRACT

A process for producing a semiconductor device includes the step of locally heating and fusing an island of a polycrystalline or amorphous semiconductor layer which is formed on and surrounded by an insulator. In the process, at least one ridge is formed on the underlying insulator before the formation of the semiconductor layer.

8 Claims, 3 Drawing Figures

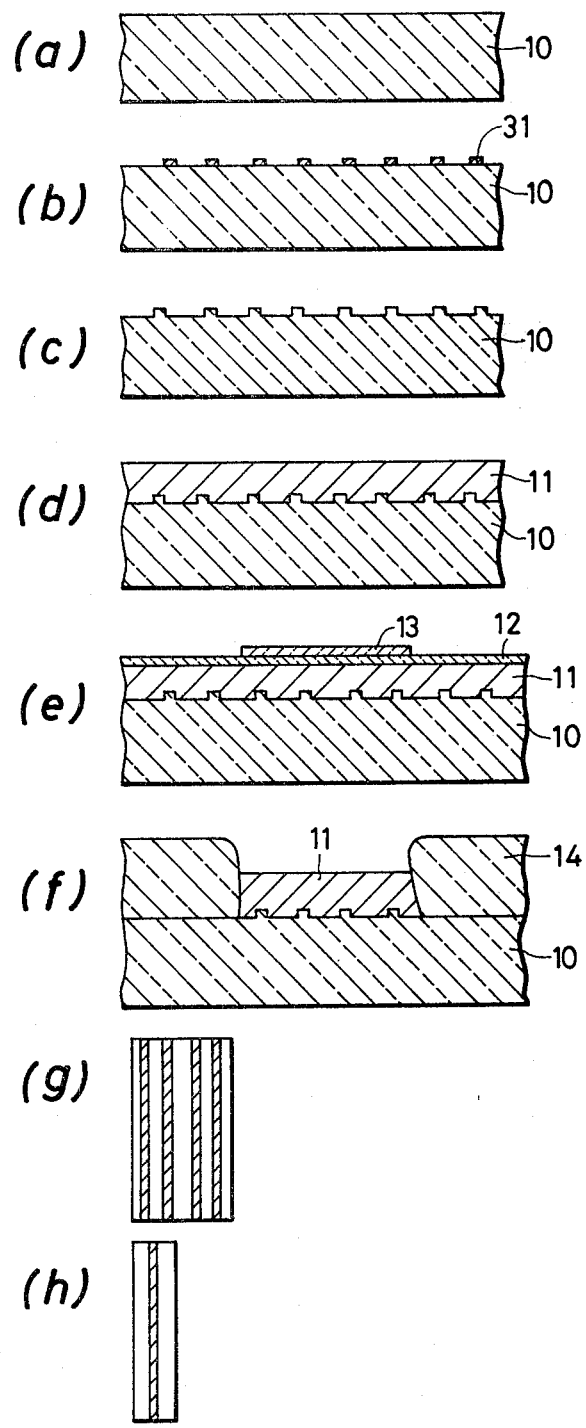

PROCESS FOR FABRICATING A SEMICONDUCTOR DEVICE

BACKGROUND OF THE INVENTION

The present invention relates to a process for fabricating a semiconductor device, and particularly to a process for forming a monocrystalline semiconductor film on an insulator.

To meet the demand for high-speed and high-packaging-density semiconductor devices, attempts are being made to produce integrated circuits of smaller stray capacitance wherein the circuit elements are isolated from each other by dielectrics. According to one attempt, the circuit elements are formed within an island of semiconductor crystal on an insulator. A typical method of forming a single semiconductor crystal consists of first depositing a polycrystalline or amorphous semiconductor film on an insulator, and then converting the surface of the film to a monocrystalline semiconducter layer by heating it with high-energy radiation such as a laser or electron beam.

This conventional method is described by reference to FIG. 1. In FIG. 1(a), the reference numeral 10 indicates a quartz ($SiO_2$) substrate, and 11 is a layer of polycrystalline silicon formed to a thickness of 5,000 Å on the substrate by a conventional chemical vapor deposition method (CVD) in reduced pressure. As shown in FIG. 1(b), an oxide film 12 is formed to a thickness of 500 Å on the silicon layer at 950° C. in an oxidizing atmosphere, and then a nitride film 13 is formed to a thickness of 1,000 Å on the oxide film by CVD under a reduced pressure, and the nitride film is photoetched to a predetermined pattern as shown in FIG. 1(c). The product is exposed to an oxidizing atmosphere at 950° C. for an extended period until all areas not covered with the nitride film 13 are oxidized, and thereafter the nitride film and the underlying oxide film 13 are removed to provide a structure which, as shown in FIG. 1(d), has a layer of polycrystalline silicon surrounded by insulating silicon dioxide (quartz glass) on the bottom and four sides. But the polycrystalline silicon as such does not have crystallinity suitable for fabrication of the desired semiconductor device, so it must be converted to monocrystalline silicon or recrystallized to polycrystalline silicon of a large grain size by fusing it with high-energy radiation such as a narrow laser beam or electron beam. However, in the conventional method, heat dissipates in an uncontrolled manner through the surrounding insulation layer downwardly and transversely, so premature cooling often occurs and many crystal nuclei form to make the production of large grains difficult, to say nothing of the formation of single crystals. To avoid this problem, an insulating layer, for instance a nitride film 15 having a thickness of about 100 Å, may be formed on the whole surface of the polycrystalline silicon layer 11 and silicon dioxide layer 14 as shown in FIG. 1(e), and by so doing, heat conduction through the polycrystalline silicon can be controlled in such a manner that it is converted to a layer of monocrystalline silicon. But this technique is not applicable to a case where the heat source is high-energy radiation other than a laser beam. Even if a laser beam is used, the nitride film 15 serves as an anti-reflection layer, and the slightest change in its thickness may cause fluctuations in the laser output, which in turn leads to the formation of a monocrystalline silicon layer whose thickness varies from operation to operation.

FIG. 2 shows the sequence of one method of forming an MOS transistor from an island of the so prepared monocrystalline silicon layer. The process of forming a silicon-gated MOS transistor is well known and requires no detailed accounting. But the major problem with this process arises in the gate oxide film which is indicated at 21 in FIG. 2(b). Since the island silicon layer does not have a controlled grain size or crystal axis, the oxide film formed on it does not have a uniform thickness, nor can it have a uniform distribution of charge. If MOS transistors are formed using this oxide film, their characteristics will vary within the same wafer or from one wafer to another. Turning now to FIG. 2(c), a polycrystalline silicon gate 22 is formed on the oxide film 21 by photo-etching and in FIG. 2(d), a source-drain region 23 is formed under the oxide film 21, and as shown in FIG. 2(e), a complete device is produced by forming layer-isolating insulating films 24, an aluminum wire connection 25 and a surface protective film 26.

SUMMARY OF THE INVENTION

An object of the present invention is to provide an improved method of producing a semiconductor device wherein a polycrystalline semiconductor layer is formed on an insulator layer which has a land in at least one area, and wherein the semiconductor layer is illuminated with high-energy radiation to be fused while heat conduction takes place in a controlled fashion to produce a recrystallized semiconductor layer of improved and uniform quality.

BRIEF DESCRIPTION OF THE DRAWINGS

FIGS. 3(a)-3(h) show in cross section the sequence of a process of making an island semiconductor layer according to one embodiment of the present invention.

DETAILED DESCRIPTION OF THE PREFERRED EMBODIMENTS

Figure 1:
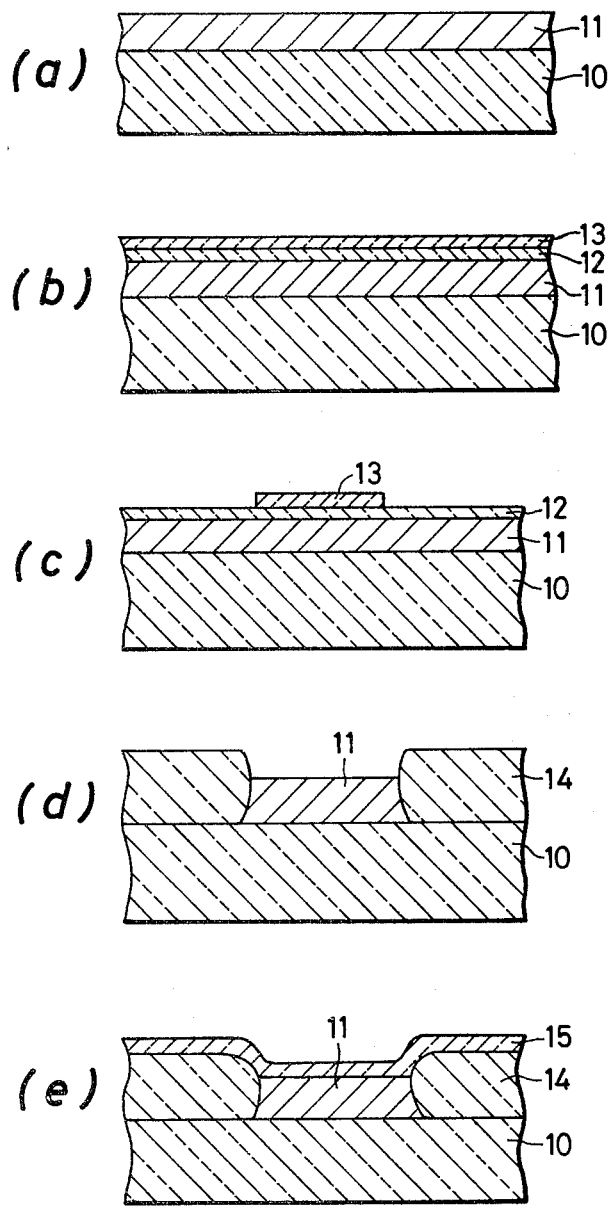
FIGS. 1(a)-(e) show in cross section the sequence of a conventional process of producing an island semiconductor layer.
Figure 2:
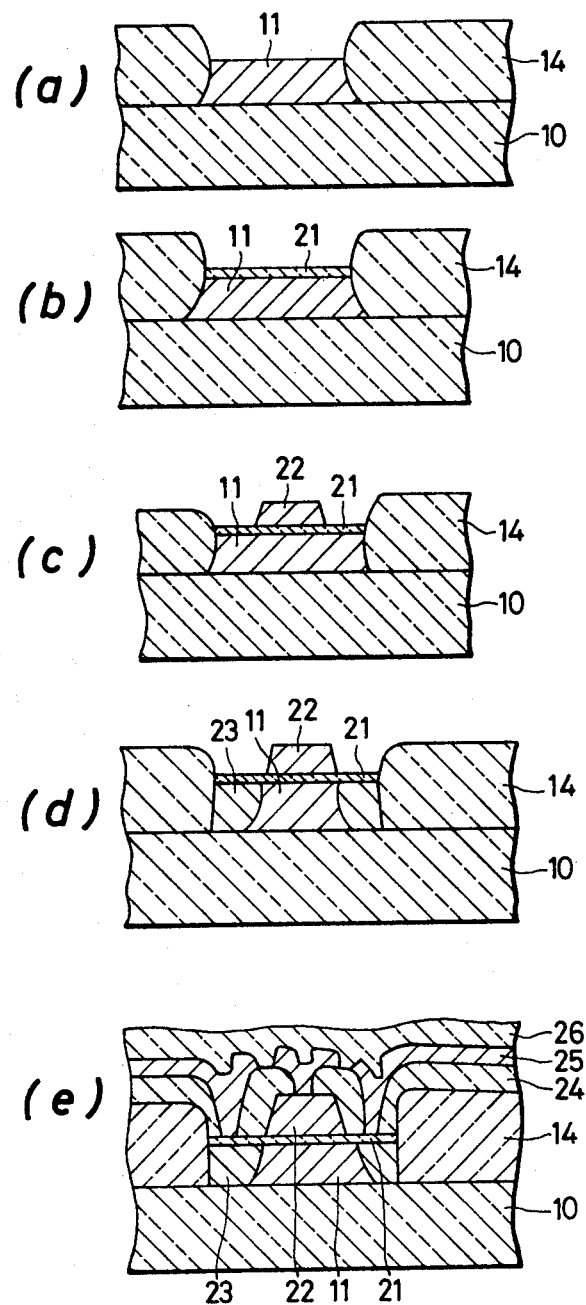
FIGS. 2(a)-2(e) show in cross section the sequence of a process of fabricating an MOS transistor using the conventional island semiconductor layer.

In FIG. 3(a), a quartz substrate 10 is shown, and on this substrate, a photoresist pattern with a line width of 2 $\mu$m and an inter-line distance of 8 $\mu$m is formed as shown in FIG. 3(b). The substrate is subjected to reactive ion etching in an etching gas to form a grating pattern 3,000 Å deep, from which the resist is removed as shown in FIG. 3(c). Subsequently, a polycrystalline silicon layer 11 is formed to a thickness of 5,000 Å by CVD in a reduced pressure as shown in FIG. 3(d). An oxide film 12 is formed in an oxidizing atmosphere at 950° C. and a nitride film 13 is formed by CVD in a reduced pressure and photo-etched according to a predetermined pattern as shown in FIG. 3(e). After exposing the product to an oxidizing atomosphere at 950° C., the patterned nitride film 13 and the underlying oxide film 12 are removed as shown in FIG. 3(f). FIGS. 3(g) and (h) are plan views of FIG. 3(f). FIG. 3(g) shows one section of the patterned island of polycrystalline silicon layer 11, which measures 40 $\mu$m $\times$ 80 $\mu$m and contains four ridges. FIG. 3(h) shows another section which measures 10 $\mu$m $\times$ 80 $\mu$m and which contains only one center ridge. The width of one ridge and the distance between ridges are determined by the spot size of the high-energy radiation used, or the area of the polycrystalline layer to be fused by illumination with the radiation. In the illustrated embodiment, a laser beam having a spot size of 50 to 60 μm is used, and the ridge width and inter-ridge distance are set at 2 μm and 8 μm, respectively, so that their sum is about one-fifth of the spot size of the laser beam. When scanning the structure of FIG. 5(f) with a laser beam, the scanning direction may be parallel to or perpendicular to the ridges, but longitudinal scanning is preferred if the pattern size exceeds the spot size. Upon illumination, the polycrystalline silicon later 11 melts. When it solidifies, the silicon directly above the ridge solidifies slower than the other parts. Because the ridge part of the underlying insulator is thicker than the other parts so that heat radiation from the ridge part is not allowed readily. That is, the solidification of the silicon begins with recess parts and terminates at the ridge parts. Therefore, grain boundaries are always formed on the ridges, but monocrystalline silicon or recrystalline silicon having extremely large grains are formed on the other regions. The stucture of FIG. 3(f) is subsequently processed as in the conventional manner to fabricate the desired semiconductor device.

In the illustrated embodiment, a laser beam is used as the heat source, but the same result may be obtained with an electron beam. Furthermore, instead of forming ridges on the entire surface of the substrate, such may be formed in only a specific patterned section by mask alignment. The ridges do not have to have a rectangular cross section, but, instead, may have any suitable inclination to permit control over the direction of crystal plane growth.

As described in the foregoing, the process of the present invention is characterized by forming ridges on the surface of an insulator below the island of polycrystalline semiconductor layer for the purpose of heat conduction through the semiconductor layer and control over crystal growth. Therefore, when the layer is illuminated with high-energy radiation, it melts and solidifies into a monocrystalline layer or a polycrystalline phase having very large grains, and by using this recrystallized semiconductor layer, a device having improved and consistent characteristics can be fabricated.

What is claimed is:

1. A process for producing a semiconductor device, comprising; forming an island of a polycrystalline or amorphous semiconductor layer on, and surrounding the same by, an insulator, locally heating said layer to fuse the same to form a recrystallized structure and forming at least one ridge on the underlying insulator before the formation of said layer.

2. A process according to claim 1, wherein said heating is effected with a laser or electron beam.

3. A process according to claim 1, wherein said local heating is effected by moving said laser beam or electron beam relative to said layer.

4. A process for producing a semiconductor device, comprising; providing an insulating substrate and forming at least one ridge therein, providing an island of polycrystalline or amorphous semiconductor material with an insulator, and heating said semiconductor material to allow recrystallization thereof.

5. A process according to claim 4, including controlling the shape of said ridge to thereby control the planes of crystal growth during recrystallinzation.

6. A process according to claim 4, wherein said heating is effected with a laser or electron beam.

7. A process acording to claim 4, a plurality of ridges being formed in said substrate by etching the same.

8. A process according to claim 7, said heating being locally effected by means of a scanning high-energy beam of radiation, said ridges being formed at intervals such that said intervals are smaller than a spot size of said beam.

* * * * *